United States Patent
Kim et al.

(10) Patent No.: US 9,859,910 B1
(45) Date of Patent: Jan. 2, 2018

(54) ANALOG TO DIGITAL CONVERTER AND SEMICONDUCTOR APPARATUS USING THE SAME

(71) Applicant: SK hynix Inc., Icheon-si, Gyeonggi-do (KR)

(72) Inventors: Dong Hyun Kim, Icheon-si (KR); Soon Ku Kang, Icheon-si (KR); Kwan Su Shon, Guri-si (KR); Yo Han Jeong, Seoul (KR); Eun Ji Choi, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/632,648

(22) Filed: Jun. 26, 2017

(30) Foreign Application Priority Data

Feb. 13, 2017 (KR) .......................... 10-2017-0019541

(51) Int. Cl.
| | |
|---|---|
| *H03M 1/34* | (2006.01) |
| *H03M 1/12* | (2006.01) |
| *H04N 5/374* | (2011.01) |
| *H04N 5/378* | (2011.01) |
| *H03M 1/06* | (2006.01) |
| *H03K 5/24* | (2006.01) |
| *H03M 1/56* | (2006.01) |
| *H03M 1/10* | (2006.01) |
| *H03M 1/80* | (2006.01) |
| *H03M 1/00* | (2006.01) |

(52) U.S. Cl.
CPC .......... *H03M 1/1295* (2013.01); *H03K 5/249* (2013.01); *H03K 5/2481* (2013.01); *H03M 1/0607* (2013.01); *H03M 1/1019* (2013.01); *H03M 1/56* (2013.01); *H04N 5/378* (2013.01); *H04N 5/3742* (2013.01); *H03M 1/00* (2013.01); *H03M 1/12* (2013.01); *H03M 1/804* (2013.01)

(58) Field of Classification Search
CPC .......... H03M 1/00; H03M 1/12; H03M 1/804
USPC ................. 341/164, 172, 118, 110, 155, 156
See application file for complete search history.

(56) References Cited

U.S. PATENT DOCUMENTS 9,432,037 B2 * 8/2016 Oh .......................... H03M 1/06

FOREIGN PATENT DOCUMENTS

KR 1020150126597 A 11/2015

* cited by examiner

*Primary Examiner* — Joseph Lauture
(74) *Attorney, Agent, or Firm* — William Park & Associates Ltd.

(57) ABSTRACT

An analog to digital converter includes a first DAC unit configured to vary a level of a reference voltage output through a first node according to a first code, a second DAC unit coupled in parallel to the first DAC unit on the basis of the first node and configured to vary the level of the reference voltage according to a second code, a comparator configured to generate a comparison result signal by comparing an input voltage and the reference voltage, and at least one register array configured to store the first code and the second code with initial values and store the first code and the second code by varying values of the first code and the second code according to the comparison result signal.

20 Claims, 5 Drawing Sheets

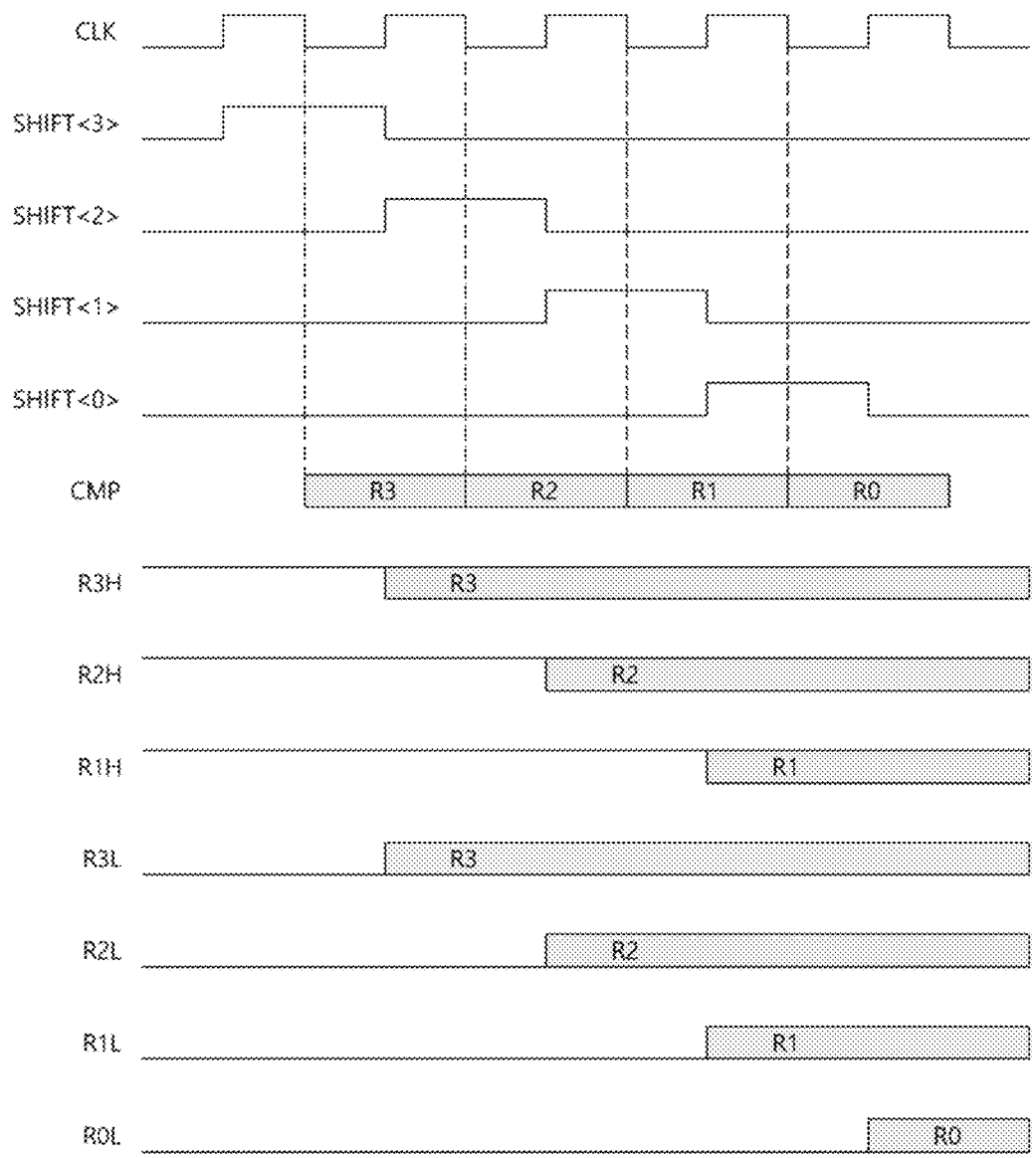

US 9,859,910 B1

ANALOG TO DIGITAL CONVERTER AND SEMICONDUCTOR APPARATUS USING THE SAME

CROSS-REFERENCES TO RELATED APPLICATION

The present application claims priority under 35 U.S.C. §119(a) to Korean application number 10-2017-0019541, filed on Feb. 13, 2017, in the Korean Intellectual Property Office, which is incorporated herein by reference in its entirety.

BACKGROUND

1. Technical Field

Various embodiments may generally relate to a semiconductor circuit, and more particularly, to an analog to digital converter (ADC) and a semiconductor apparatus using the same.

2. Related Art

Semiconductor apparatuses may include ADCs to store analog signals by converting the analog signals to digital signals.

Accordingly, a circuit area and power consumption in the semiconductor apparatuses may be inevitably increased due to the ADCs included therein. It is important to minimize the increase in the circuit area and reduce the power consumption in the semiconductor apparatuses including the ADCs by simplifying the logic design of the ADCs.

SUMMARY

Various embodiments are provided to an ADC capable of minimizing an increase in a circuit area and reducing power consumption and a semiconductor apparatus using the same.

In an embodiment of the present disclosure, an analog to digital converter (ADC) may include: a first digital to analog conversion (DAC) unit configured to vary a level of a reference voltage output through a first node according to a first code; a second DAC unit coupled in parallel to the first DAC unit on the basis of the first node and configured to vary the level of the reference voltage according to a second code; a comparator configured to generate a comparison result signal by comparing an input voltage and the reference voltage; and at least one register array configured to store the first code and the second code with initial values and store the first code and the second code by varying values of the first code and the second code according to the comparison result signal.

In an embodiment of the present disclosure, an analog to digital converter (ADC) may include: a plurality of first lag circuits activated according to a first code; and a plurality of second lag circuits activated according to a second code and coupled in parallel to the plurality of first lag circuits on the basis of a first node. Initial values of the first code and the second code may be set to levels for activating at least one of the plurality of first lag circuits and the plurality of second lag circuits and inactivating all other ones of the plurality of first lag circuits and the plurality of second lag circuits. The first code and the second code may be adjusted according to a comparison result of an input voltage and a reference voltage varied according to the plurality of first lag circuits and the plurality of second lag circuits.

In another embodiment of the present disclosure, a semiconductor apparatus may include: a replication driver configured by replicating a driver of a data output terminal and configured to vary a current amount of the replication driver according to a first code and a second code; an external resistor; a comparator configured to output a comparison result by comparing a reference voltage and a distribution voltage distributed according to a resistance distribution ratio of an internal resistor of the replication driver and the external resistor; a first register array configured to vary the first code according to an output signal of the comparator; and a second register array configured to vary the second code according to the output signal of the comparator.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIG. 3 is a timing diagram explaining an operation of an ADC according to an embodiment of the present disclosure;

DETAILED DESCRIPTION

Various embodiments of the present disclosure will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the inventive concept. Although a few embodiments of the present disclosure will be shown and described, it will be appreciated by those of ordinary skill in the art that changes may be made in these embodiments without departing from the principles and spirit of the present disclosure.

Figure 1:
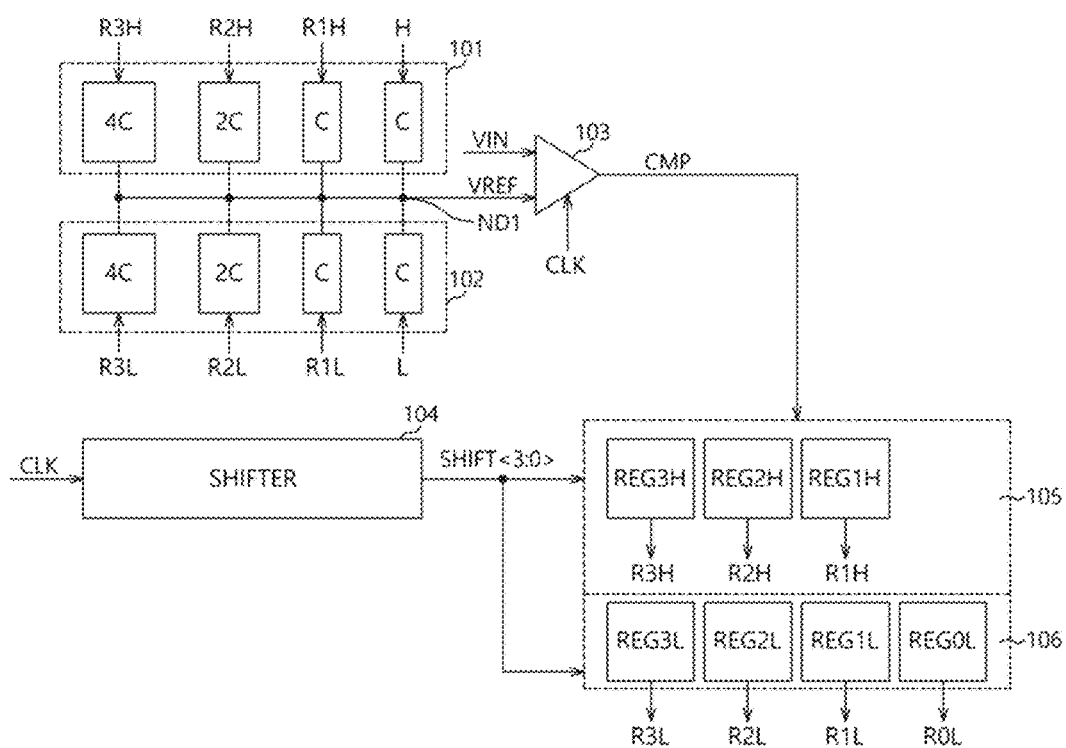
FIG. 1 is a diagram illustrating a configuration of an ADC according to an embodiment of the present disclosure.

As illustrated in FIG. 1, an analog to digital converter (hereinafter, referred to as ADC) 100 according to an embodiment may include a first digital to analog conversion (hereinafter, referred to as DAC) unit 101, a second DAC unit 102, a comparator 103, a shifter 104, a first register array 105, and a second resister array 106.

The first DAC unit 101 and the second DAC unit 102 may vary a level of a reference voltage VREF according to a first code R3H, R2H, and R1H and a second code R3L, R2L, and R1L and output the level-varied reference voltage.

The first DAC unit 101 may include a plurality of first lag circuits 4C, 2C, C, and C coupled in series on the basis of an output node ND1 through which the reference voltage VREF is output.

The plurality of first lag circuits 4C, 2C, C, and C may be configured to have binary-weighted capacitances. For example, the lag circuit 2C may have capacitance twice larger than that of the lag circuit C and the lag circuit 4C may have capacitance four times larger than that of the lag circuit C.

Bit signals R3H, R2H, and R1H of the first code R3H, R2H, and R1H may be input to the lag circuits 4C, 2C, and C among the plurality of first lag circuits 4C, 2C, C, and C in the first DAC unit 101 and a signal input to the last lag circuit C may be fixed to logic high H.

At least one lag circuit to which a bit signal of the first code R3H, R2H, and R1H having a logic high level is input among the plurality of first lag circuits may be activated. The initial values of the first code R3H, R2H, and R1H may be set to levels for activating at least one of the plurality of first lag circuits 4C, 2C, C, and C, and inactivating one or more of the plurality of first lag circuits 4C, 2C, C, and C.

The second DAC unit 102 may include a plurality of second lag circuits 4C, 2C, C, and C coupled in series on the basis of the output node ND1 through which the reference voltage VREF is output.

Bit signals R3L, R2L, and R1L of the second code R3L, R2L, and R1L may be input to the lag circuits 4C, 2C, and C among the plurality of second lag circuits 4C, 2C, C, and C in the second DAC unit 102 and a signal input to the last lag circuit C may be fixed to logic low L.

At least one lag circuit, to which one of bit signals of the second code R3L, R2L, and R1L having a logic high level is input among the plurality of second lag circuits, may be activated. The initial values of the second code R3L, R2L, and R1L may be set to levels for activating at least one of the plurality of second lag circuits 4C, 2C, C, and C, and inactivating one or more of the plurality of second lag circuits 4C, 2C, C, and C.

The plurality of first lag circuits 4C, 2C, C, and C in the first DAC unit 101 may be coupled in parallel to the plurality of second lag circuits 4C, 2C, C, and C in the second DAC unit 102 on the basis of the output node ND1 through which the reference voltage VREF is output.

For example, the lag circuit 4C in the first DAC unit 101 may be coupled in parallel to the lag circuit 4C in the second DAC unit 102 on the basis of the output node ND1.

The lag circuit 2C in the first DAC unit 101 may be coupled in parallel to the lag circuit 2C in the second DAC unit 102 on the basis of the output node ND1.

The lag circuit C in the first DAC unit 101 may be coupled in parallel to the lag circuit C in the second DAC unit 102 on the basis of the output node ND1. At a higher level, the first DAC unit 101 may be coupled in parallel to the second DAC unit 102 on the basis of the output node ND1.

The plurality of first lag circuits 4C, 2C, C, and C in the first DAC unit 101 may be coupled in series on the basis of the output node ND1. For example, when all the plurality of first lag circuits 4C, 2C, C, and C are activated, the first DAC unit 101 may have a capacitance of 4C corresponding to ½ of 8C which is a sum of capacitances 4C, 2C, C, and C of the plurality of first lag circuits 4C, 2C, C, and C.

In another example, when the lag circuits 2C, C, and C of the plurality of first lag circuits 4C, 2C, C, and C in the first DAC unit 101 are activated, the first DAC unit 101 may have capacitance of 2C corresponding to ¼ of 8C which is the sum of the capacitances 4C, 2C, C, and C of the plurality of first lag circuits 4C, 2C, C, and C.

The comparator 103 may generate the comparison result signal CMP by comparing an input voltage VIN and the reference voltage VREF.

The comparator 103 may output the comparison result signal CMP of logic high H when the input voltage VIN is larger than the reference voltage VREF and may output the comparison result signal CMP of logic low L when the input voltage VIN is smaller than the reference voltage VREF.

The shifter 104 may generate a register control signal SHIFT<3:0> according to a clock signal CLK.

The shifter 104 may perform frequency division by 2 on the clock signal CLK and output the frequency-divided clock signal as the register control signal SHIFT<3:0> by shifting the frequency-divided clock signal.

The first register array 105 may include a plurality of first registers REG3H, REG2H, and REG1H.

The plurality of first registers REG3H, REG2H, and REG1H may output signals stored therein as the first code R3H, R2H, and R1H.

The first register array 105 may sequentially store the bit signals of the first code R3H, R2H, and R1H with preset initial values and sequentially store the comparison result signal CMP by replacing any one of the bit signals of the first code R3H, R2H, and R1H with the comparison result signal CMP according to the register control signal SHIFT<3:0>.

For example, the first register array 105 may store all the bit signals of the first code R3H, R2H, and R1H with logic high H and may store the comparison result signal CMP in a register which is activated according to the register control signal SHIFT<3:0> among the plurality of first registers REG3H, REG2H, and REG1H.

The second register array 106 may include a plurality of second registers REG3L, REG2L, REG1L, and REG0L.

The registers REG3L, REG2L, and REG1L among the plurality of second registers REG3L, REG2L, REG1L, and REG0L may output signals stored therein as the bit signals R3L, R2L, and R1L of the second code R3L, R2L, and R1L.

The second register array 106 may sequentially store the bit signals of the second code R3L, R2L, and R1L with preset initial values and sequentially store the comparison result signal CMP by replacing any one of the bit signals of the second code R3L, R2L, R1L, and R0L with the comparison result signal CMP according to the register control signal SHIFT<3:0>.

For example, the second register array 106 may store all the bit signals of the second code R3L, R2L, R1L, and R0L with logic low L and may store the comparison result signal CMP in a register which is activated according to the register control signal SHIFT<3:0> among of the plurality of second registers REG3L, REG2L, REG1L, and REG0L.

In an embodiment, the plurality of first lag circuits 4C, 2C, and C in the first DAC unit 101 may be directly coupled to the plurality of first registers REG3H, REG2H, and REG1H in the first register array 105.

In an embodiment, the plurality of second lag circuits 4C, 2C, C, and C in the second DAC unit 102 may be directly coupled to the plurality of second registers REG3L, REG2L, REG1L, and REG0L in the second register array 106.

Figure 2A:
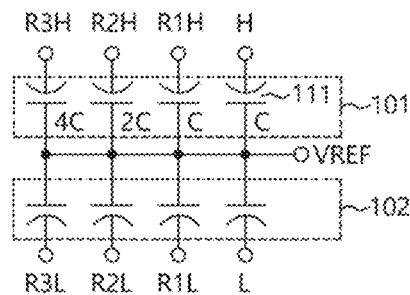
FIG. 2A to 2C are diagrams illustrating configuration examples of first and second digital to analog conversion (DAC) units of FIG. 1.
Figure 2B:
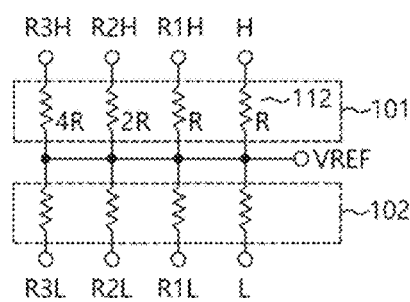
Figure 2C:
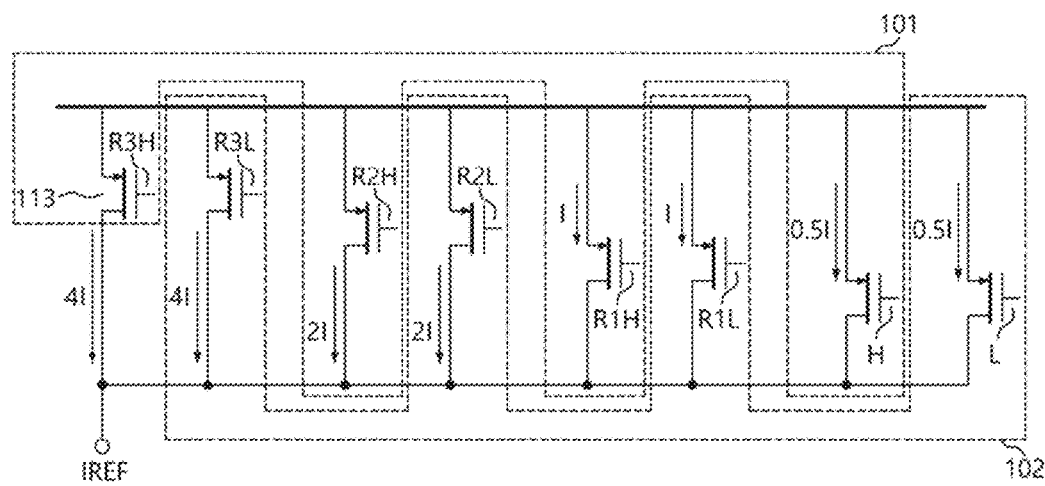

The first and second DAC units 101 and 102 according to an embodiment may be configured having any one of DAC units illustrated in FIGS. 2A to 2C.

As illustrated in FIG. 2A, the first and second DAC units 101 and 102 may be configured of a plurality of capacitors 111 to have the binary-weighted capacitances as descried with reference to FIG. 1.

As illustrated in FIG. 2B, the first and second DAC units 101 and 102 may be configured of a plurality of resistors 112 to have binary-weighted resistances.

As illustrated in FIG. 2C, the first and second DAC units 101 and 102 may be configured of a plurality of transistors 113 so that an amount of current according to a binary-weighted manner flows. The currents flowing through the first and second DAC units 101 and 102 may be used as a reference current IREF other than the reference voltage VREF of FIGS. 2A and 2B.

Figure 4:
FIG. 4 is a table illustrating variation in values stored in a first register array and a second register array according to a comparison result signal of FIG. 1.

An operation of the ADC 100 according to an embodiment will described with reference to FIGS. 3 and 4.

First, in an initial operation, all the bit signals of the first code R3H, R2H, and R1H may have the logic high level and all the bit signals of the second code R3L, R2L, R1L, and R0L may have the logic low level as described with reference to FIG. 1.

The capacitance of the activated DAC unit 101 may be ½ maximum capacitance due to the capacitor serial connection structure.

Accordingly, the reference voltage VREF may have a level, for example, corresponding to ½ power voltage in the initial operation through capacitive division.

Bit signals of the register control signal SHIFT<3:0>, for example, shift<3>, shift<2>, shift<1>, and shift<0> may be sequentially activated in one cycle period of the clock signal CLK at a rising edge of the clock signal CLK.

The comparison result signal CMP may be sequentially generated or transited to a logic high H or logic low L at a falling edge of the clock signal CLK.

As the bit signal shift<3> of the register control signal SHIFT<3:0> is activated at the rising edge of the clock signal CLK, the comparison result signal CMP may be simultaneously stored in the resisters REG3H and REG3L corresponding to the most significant bit (MSB) signals of the first code R3H, R2H, and R1H and the second code R3L, R2L, R1L, and R0L, for example, R3H and R3L.

The signal values simultaneously stored in the registers REG3H and REG3L are the same as each other. For example, the signal values simultaneously stored in the registers REG3H and REG3L may equally have the logic high level or the logic low level. Accordingly, for clarity, the registers REG3H and REG3L may be collectively referred to as R3.

For example, when the register R3 is logic low, the reference voltage VREF may be adjusted to a level corresponding to ¼ power voltage.

The comparison result signal CMP generated by comparing the input voltage VIN and the reference voltage VREF boosted or dropped through the above-described method may be simultaneously stored in the registers REG2H and REG0L which are collectively referred to as R2.

Next comparison result signal CMP on the basis of the clock signal CLK may be stored in the registers REG1H and REG1L which are collectively referred to as R1.

Next comparison result signal CMP on the basis of the clock signal CLK may be stored in the resistor REG0L, which is referred to as R0, corresponding to the least significance bit (LSB) signal of the second code R3L, R2L, R1L and R0L and thus the analog to digital conversion operation may be completed.

When the analog to digital conversion operation is completed, the bit signals of the first code R3H, R2H, and R1H may have the same values as those of the second code R3L, R2L, and R1L.

The second code R3L, R2L, R1L, and R0L may be provided to the outside as a final output that the input voltage VIN is converted into a digital signal.

Figure 5:
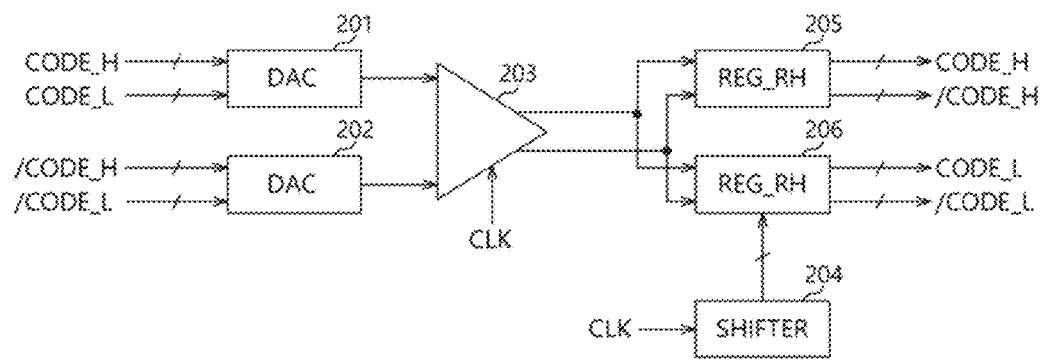
FIG. 5 is a diagram illustrating a configuration of an ADC according to another embodiment of the present disclosure.

As illustrated in FIG. 5, a differential type ADC 200 according to another embodiment may include a first DAC unit 201, a second DAC unit 202, a comparator 203, a shifter 204, a first register array 205, and a second register array 206.

The first DAC unit 201 which may be configured to have the same structure as that of the combined first DAC unit 101 and second DAC unit 102 of FIG. 1.

The first DAC unit 201 may generate an output voltage according to signals CODE_H and CODE_L having the same values as the first code R3H, R2H, and R1H and the second code R3L, R2L, R1L, and R0L described with reference to FIG. 1.

The second DAC unit 202 may have the same configuration as the first DAC unit 201 and may generate an output voltage according to signals /CODE_H and /CODE_L which are differential signals of the signal CODE_H and CODE_L.

The comparator 203 may generate a differential type output signal by comparing the output voltage of the first DAC unit 201 and the output voltage of the second DAC unit 202.

The shifter 204 may be configured to have the same configuration as the shifter 104 of FIG. 1.

The first register array 205 may vary and generate at least one of the signal CODE_H and the signal /CODE_H which is the differential signal of the signal CODE_H according to at least one of the output of the comparator 203 and the output of the shifter 204.

The first register array 205 may include the configuration of the first register 105 of FIG. 1 and may generate the signal CODE_H using the configuration of the first register array 105. The first register array 205 may further include a circuit component configured to generate the differential signal /CODE_H, for example, an inverter array.

The second register array 206 may vary and generate at least one of the signal CODE_L and the differential signal /CODE_L of the signal CODE_L according to at least one of the output of the comparator 203 and the output of the shifter 204.

The second register array 206 may be configured to have the same configuration as the first register array 205.

A semiconductor apparatus 300 according to an embodiment may be an impedance adjustment circuit using an ADC.

Figure 6:
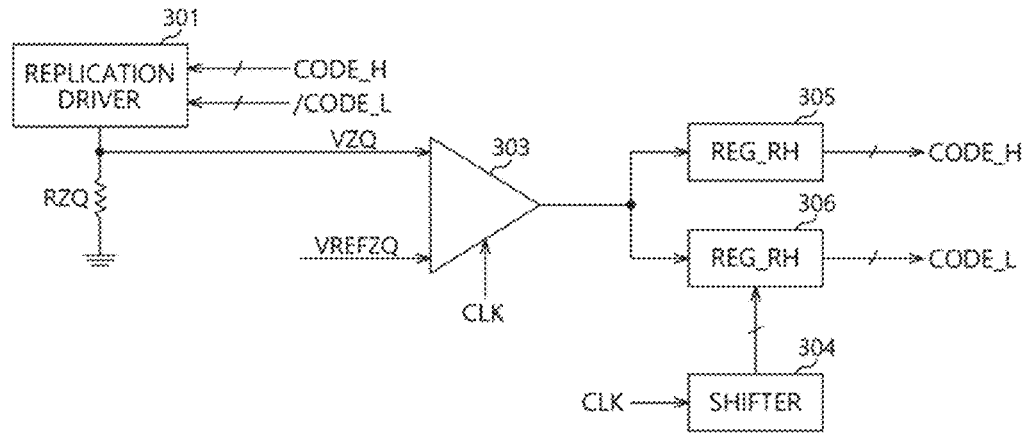
FIG. 6 is a diagram illustrating a configuration of a semiconductor apparatus according to an embodiment of the disclosure.

As illustrated in FIG. 6, the semiconductor apparatus 300 according to an embodiment may include a replication driver 301, a comparator 303, a shifter 304, a first register array 305, and a second register array 306.

The replication driver 301 may be configured by replicating a driver configured in a data output terminal of the semiconductor apparatus, for example, a pull-up driver configured to pull up a data signal or a pull-down driver configured to pull down the data signal.

For example, the replication driver 301 may include any one of the first DAC unit 101 and the second DAC 102 of FIG. 1 based on the configuration of FIG. 2C. In another example, the replication driver 301 may include both the first DAC unit 101 and the second DAC 102 of FIG. 1 based on the configuration of FIG. 2C.

The replication driver 301 may vary a current amount according to the signals CODE_H and CODE_L.

The current flowing through the replication driver 301 may be converted into a distribution voltage VZQ distributed according to a resistance distribution ratio of an internal resistor of the replication driver 301 and an external resistor RZQ.

The comparator 303 may generate a comparison result by comparing the distribution voltage VZQ and a reference voltage VREFZQ.

The shifter 304 may have the same configuration as the shifter 104 of FIG. 1.

The first register array 305 may generate the signal CODE_H according to an output of the comparator 303 and an output of the shifter 304. The first register array 305 may be coupled to the replication driver 301 via the comparator 303.

The first register array 305 may include the configuration of the first register array 105 of FIG. 1 and may generate the signal CODE_H using the configuration of the first resister array 105.

The second register array 306 may generate the signal CODE_L according to the output of the comparator 303 and the output of the shifter 304. The second register array 306 may be coupled to the replication deriver 301 via the comparator 303.

The second register array 306 may have the same configuration as the first register array 305.

The signals CODE_H and CODE_L generated from the first register array 305 and the second register array 306 may be provided to the pull-up driver and the pull-down driver configured in the data output terminal of the semiconductor apparatus.

The resistance values of the pull-up driver and the pull-down driver may be adjusted to target values according to the signals CODE_H and CODE_L.

The above described embodiments of the present disclosure are intended to illustrate and not to limit the present disclosure. Various alternatives and equivalents are possible. The disclosure is not limited by the embodiments described herein. Nor is the disclosure limited to any specific type of semiconductor device. Other additions, subtractions, or modifications are obvious in view of the present disclosure and are intended to fall within the scope of the appended claims.

What is claimed is:

1. An analog to digital converter (ADC) comprising:
a first digital to analog conversion (DAC) unit configured to vary a level of a reference voltage output through a first node according to a first code;
a second DAC unit coupled in parallel to the first DAC unit on the basis of the first node and configured to vary the level of the reference voltage according to a second code;
a comparator configured to generate a comparison result signal by comparing an input voltage and the reference voltage; and
at least one register array configured to store the first code and the second code with initial values and store the first code and the second code by varying values of the first code and the second code according to the comparison result signal.

2. The ADC of claim 1, further comprising a shifter configured to generate a register control signal for selectively activating registers of the at least one register array according to a clock signal.

3. The ADC of claim 1, further comprising a shifter configured to generate a register control signal for selectively activating registers of the at least one register array by dividing and shifting a clock signal.

4. The ADC of claim 1, wherein the first DAC unit includes a plurality of first lag circuits coupled in series on the basis of the first node.

5. The ADC of claim 4, wherein the plurality of first lag circuits are configured to have binary-weighted capacitances.

6. The ADC of claim 4, wherein the second DAC unit includes a plurality of second lag circuits coupled in series on the basis of the first node, and
the first plurality of first lag circuits are coupled in parallel to the plurality of second lag circuits on the basis of the first node.

7. The ADC of claim 1, wherein the first DAC unit and the second DAC unit are directly coupled to the at least one register array.

8. The ADC of claim 1, wherein the plurality of first lag circuits and the plurality of second lag circuits are directly coupled to a plurality of registers of the at least one register array.

9. An analog to digital converter (ADC) comprising:
a plurality of first lag circuits activated according to a first code; and
a plurality of second lag circuits activated according to a second code and coupled in parallel to the plurality of first lag circuits on the basis of a first node,
wherein initial values of the first code and the second code are set to levels for activating at least one of the plurality of first lag circuits and the plurality of second lag circuits and inactivating all other ones of the plurality of first lag circuits and the plurality of second lag circuits, and
the first code and the second code are adjusted according to a comparison result of an input voltage and a reference voltage varied according to the plurality of first lag circuits and the plurality of second lag circuits.

10. The ADC of claim 9, further comprising:
a comparator configured to generate a comparison result signal by comparing the input voltage and the reference voltage; and
at least one register array configured to store the first code and the second code with the initial values and store the first code and the second code by varying values of the first code and the second code according to the comparison result signal.

11. The ADC of claim 10, further comprising a shifter configured to selectively activate registers of the at least one register array according to a clock signal.

12. The ADC of claim 10, wherein the plurality of first lag circuits and the plurality of second lag circuits are directly coupled to registers of the at least one register array.

13. The ADC of claim 10, wherein the at least one register array is configured to sequentially store the comparison result signal sequentially generated according to a clock signal and sequentially store the comparison result signal according to an order of bit signals of the first code and the second code.

14. The ADC of claim 9, wherein the plurality of first lag circuits are configured to have binary-weighted capacitances.

15. A semiconductor apparatus comprising:
a replication driver configured by replicating a driver of a data output terminal and configured to vary a current amount of the replication driver according to a first code and a second code;
an external resistor;
a comparator configured to output a comparison result by comparing a reference voltage and a distribution voltage distributed according to a resistance distribution ratio of an internal resistor of the replication driver and the external resistor;
a first register array configured to vary the first code according to an output signal of the comparator; and
a second register array configured to vary the second code according to the output signal of the comparator.

16. The semiconductor apparatus of claim 15, wherein the first register array and the second register array are coupled to the replication driver.

17. The semiconductor apparatus of claim 15, wherein the replication driver includes:
a plurality of first lag circuits activated according to the first code; and
a plurality of second lag circuits activated according to the second code and coupled in parallel to the plurality of first lag circuits on the basis of a first node.

18. The semiconductor apparatus of claim 17, wherein initial values of the first code and the second code are set to levels for activating all ones of the plurality of first lag circuits and the plurality of second lag circuits and inactivating all the other ones of the plurality of first lag circuits and the plurality of second lag circuits.

19. The semiconductor apparatus of claim 15, further comprising a shifter configured to selectively activate registers of the first and second register arrays according to a clock signal.

20. The semiconductor apparatus of claim 15, wherein the first register array and the second register array are configured to sequentially store the output signal of the comparator sequentially generated according to a clock signal and sequentially store the comparison result signal according to an order of bit signals of the first code and the second code.

* * * * *